(12) United States Patent
Kashiwagi et al.

(10) Patent No.: US 6,342,916 B1
(45) Date of Patent: Jan. 29, 2002

(54) METHOD AND APPARATUS FOR MOUNTING ELECTRONIC COMPONENTS

(75) Inventors: Yasuhiro Kashiwagi, Maebaru; Kazuhide Nagao, Fukuoka; Jun Yamauchi, Kurume, all of (JP)

(73) Assignee: Matsushita Electric Indsutrial Co., Ltd, Osaka (JP)

( * ) Notice: Subject to any disclaimer, the term of this patent is extended or adjusted under 35 U.S.C. 154(b) by 0 days.

(21) Appl. No.: 09/252,938

(22) Filed: Feb. 19, 1999

(30) Foreign Application Priority Data

Feb. 19, 1998 (JP) .......................... 10-036968

(51) Int. Cl.$^7$ ................................. H04N 7/18
(52) U.S. Cl. .................. 348/87; 382/148; 382/151
(58) Field of Search ............................ 348/87; 382/148, 382/151; H04N 7/18

(56) References Cited

U.S. PATENT DOCUMENTS 6,081,613 A * 6/2000 Ikurumi et al. ............... 348/87

* cited by examiner

Primary Examiner—Howard Britton
(74) Attorney, Agent, or Firm—Wenderoth, Lind & Ponack, L.L.P.

(57) ABSTRACT

Trays within a tray feeder provided with electronic components requiring a higher accuracy of mounting position such as QFPs, etc. are collectively placed at one side of a recognition device equipped with a line sensor. A transfer head picks up an electronic component in the tray and discerns a position of the electronic component by moving over the line sensor in one and the same fixed direction at all the time. This scanning direction is the same as a direction of calibration of a nozzle of the transfer head. Accordingly, a detecting error in the position of electronic component caused by the scanning direction is eliminated and the electronic component can be mounted with a high positional accuracy on a substrate.

19 Claims, 6 Drawing Sheets

METHOD AND APPARATUS FOR MOUNTING ELECTRONIC COMPONENTS

FIELD OF THE INVENTION

The present invention relates to a method of mounting a variety of electronic components requiring different levels of mounting accuracy on a substrate, and an apparatus for mounting the same.

BACKGROUND OF THE INVENTION

Apparatuses for mounting electronic components widely available now are the types that mount electronic components on substrates by picking up the electronic components provided in a part feeder such as a tape feeder, a tubular feeder, a bulk feeder, a tray feeder, and the like, with a nozzle on a transfer head with vacuum suction, and moving the transfer head horizontally with an X table and a Y table.

Because an electronic component picked up by the nozzle is deviated in position, the apparatus determines a position of the electronic component with a recognition device prior to mounting the electronic component on the substrate. An optical device such as a camera with an area type CCD, a camera with a line type CCD, and the like, for observing information related to a plane, or an optical device such as laser unit for observing height information are used for the recognition device.

FIG. 6 is a plan view depicting moving loci of a transfer head of a conventional apparatus for mounting electronic components where such apparatus is provided with a line sensor for the recognition device. In the figure, a substrate 1 is set in a position on guide rails 2. A tray feeder 3 provided with two trays 3a is placed on one side of the substrate 1, and a plurality of tape feeders 4 and bulk feeders 5 are placed on the other side of the substrate 1. Also, a recognition device 6 is provided between the substrate 1 and the tray feeder 3. The recognition device is equipped with a line sensor.

The transfer head (not shown in the figure) transfers and mounts an electronic component on the substrate 1, after picking up the electronic component from the tray feeder 3, the tape feeder 4 or the bulk feeder 5 with the nozzle on the transfer head with vacuum suction, and after determining a position of the electronic component being vacuum-chucked on a lower tip of the nozzle by moving the component over the recognition device 6.

In the figure, a polygonal line A with an arrow (hereinafter called an "arrow A") is a moving locus of the transfer head, when it mounts on the substrate 1 an electronic component picked up from the tray 3a on the left side of the tray feeder 3. Similarly, arrows B, C and D are moving loci of the transfer head for mounting on the substrate 1 electronic components from the tray 3a on the right side of the tray feeder 3, the tape feeder 4, and the bulk feeder 5, respectively. In order for the apparatus to discern an electronic component, it moves the transfer head over the line sensor in a direction orthogonal to a longitudinal direction of the line sensor (an X direction in FIG. 6), and obtains plane information of the electronic component by scanning it.

In FIG. 6, the apparatus discerns an electronic component while moving the transfer head, which carries the electronic component picked up from the tray 3a on the left side, to the rightward direction (an X1 direction) as shown by the arrow A. Likewise, the apparatus discerns an electronic component while moving the transfer head which carries the electronic component picked up from the tray 3a on the right side, to the leftward direction (an X2 direction) as shown by the arrow B.

In the case of a line sensor, however, an error (a positional deviation) of one or more picture elements occurs in the data obtained for a position of the electronic component due to the direction of scanning (whether in the X1 direction or the X2 direction). It is considered that this positional deviation may be caused by a difference in flow speed of the signal output from the line sensor existing between directions of the scanning. If an error occurs in the positional data of the electronic component due to the direction of scanning, accuracy of the mounting position can not be maintained, since a preciseness of the position where the electronic component is mounted on the substrate 1 will also deviate.

Since the tray feeder normally carries certain electronic components such as QFPs that require a high accuracy for the mounting position, a positional deviation of one or more picture elements as described above can not be disregarded in the case of such electronic components. On the contrary, mounting accuracy required for electronic components provided in the tape feeder and the bulk feeder is not so high. Therefore, in general, the positional deviation as described above can practically be ignored.

Accordingly, an object of the present invention is to provide a method and an apparatus for mounting electronic components that can mount the electronic components requiring a high accuracy of the mounting position on a substrate according to the required high positional accuracy by eliminating an error in the discerned position due to scanning direction of the line sensor, when mounting a variety of electronic components requiring different levels of the mounting accuracy on the substrate.

SUMMARY OF THE INVENTION

A method of mounting electronic components of the present invention includes picking up an electronic component requiring a higher accuracy of mounting position and an electronic component requiring a lower accuracy of mounting position provided in part feeders with an electronic component pickup unit mounted on a transfer head. Next, a position of only the electronic component requiring a higher accuracy of mounting position among the electronic components picked up by the electronic component pickup unit is discerned by moving the electronic component over a line sensor unidirectionally in a fixed direction orthogonal to a longitudinal direction of the line sensor. Then, the electronic component picked up by the electronic component pickup unit is mounted on a substrate based on a discerned result of the position of the electronic component.

Since this mounting method obtains image data by moving the electronic component requiring a higher accuracy of mounting position only in a fixed direction over the line sensor, it eliminates a variance in discerning accuracy of the position due to a difference caused by the scanning direction with respect to the line sensor, so as to enable mounting of the electronic component on the substrate with a high accuracy in the mounting position.

Also, a calibration of a nozzle on the transfer head to be executed prior to mounting the electronic component is performed preferably in the same direction as the above scanning direction.

Further, an electronic-component mounting apparatus of the present invention includes a recognition device provided with a line sensor for discerning a position of an electronic component moving above the line sensor in a direction orthogonal to a longitudinal direction of the line sensor, and a part feeder placed on one side of the recognition device with respect to a direction orthogonal to the longitudinal direction of the line sensor in the recognition device, for storing electronic components requiring a higher accuracy of mounting position. The apparatus also includes a part feeder for storing electronic components requiring a lower accuracy of mounting position, and a transfer head provided with a pickup unit for picking up an electronic component from the part feeder which stores electronic components requiring a higher accuracy of mounting position and from the part feeder which stores electronic components requiring a lower accuracy of mounting position.

Since the apparatus of the foregoing structure is able to obtain image data by moving the electronic component requiring a higher accuracy of mounting position only in one fixed direction over the line sensor at all times, it can mount the electronic component on the substrate with a high accuracy in the mounting position.

DESCRIPTION OF THE PREFERRED EMBODIMENTS

First Exemplary Embodiment

A method and an apparatus for mounting electronic components of a first exemplary embodiment of the present invention will now be described by referring to FIG. 1 through FIG. 4.

Figure 1:
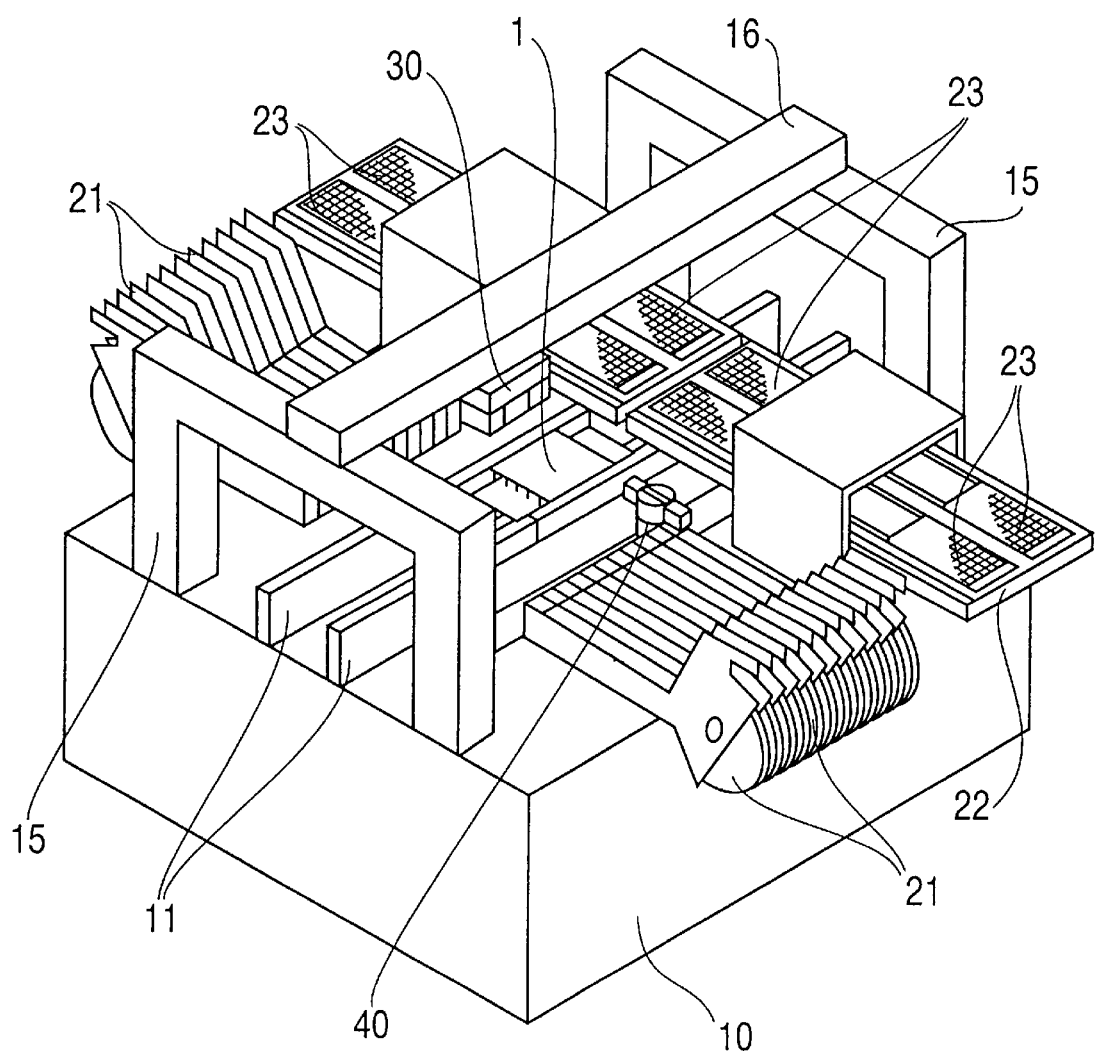
FIG. 1 is a perspective view depicting an electronic-component mounting apparatus of a first exemplary embodiment of the present invention.
Figure 2:
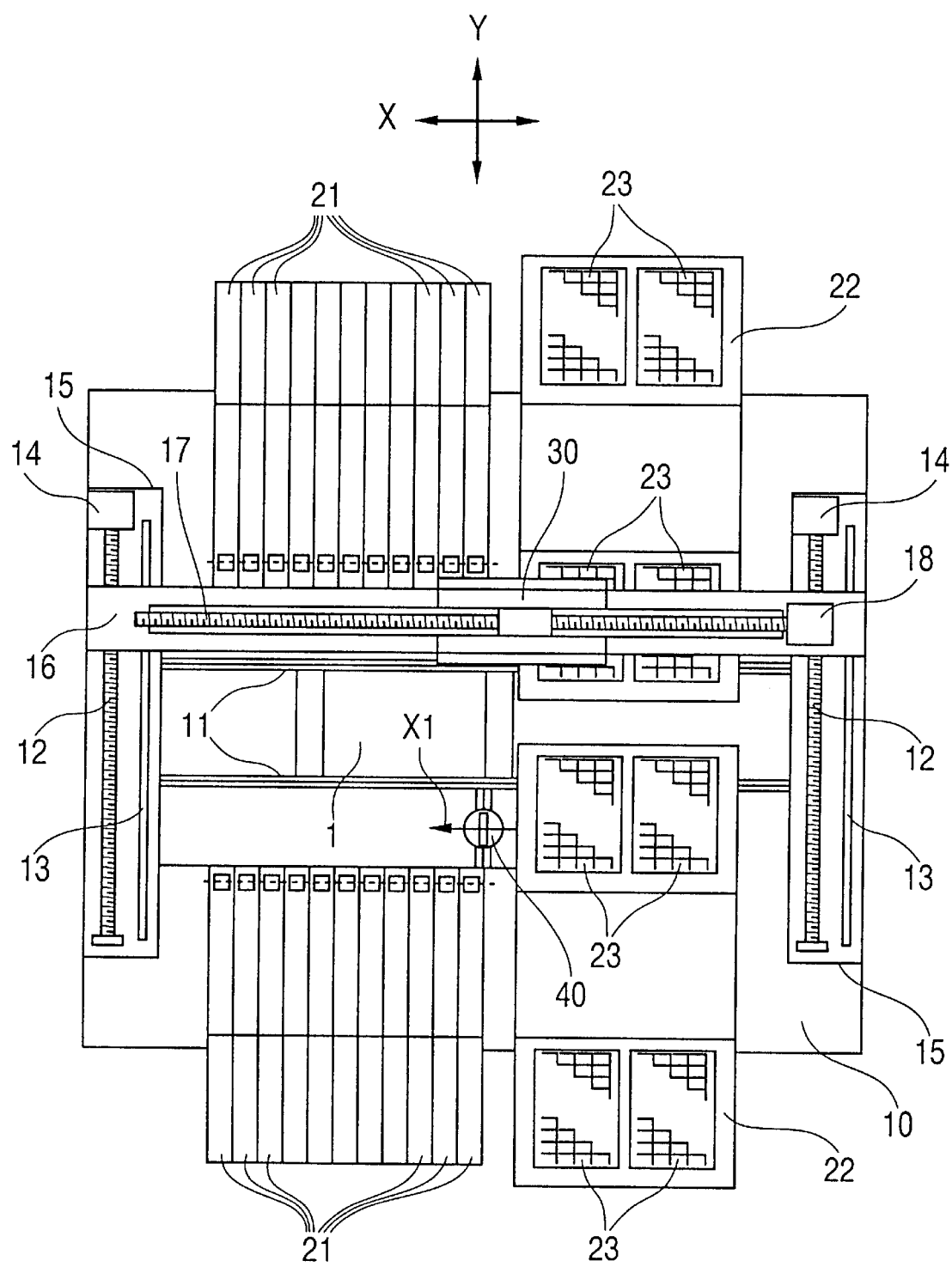
FIG. 2 is a plan view depicting the electronic-component mounting apparatus of FIG. 1.

Guide rails 11 for a substrate 1 are provided on a top center of a base 10. As shown in FIG. 2, feed screws 12 of a Y direction, linear guides 13 and motors 14 for driving the feed screws 12 are provided at both sides of an upper surface of the base 10. These components constitute a Y table and are housed inside of gate frames 15. A horizontal frame 16 is mounted on the gate frames 15 located at both sides. A feed screw 17 of an X direction and a motor 18 for driving the feed screw 17 are provided within the horizontal frame. These components constitute an X table.

A head unit 30 is mounted on an underside of the horizontal frame 16. The horizontal frame 16 moves horizontally in the Y direction along the feed screws 12 and the linear guides 13, when the motors 14 rotate. Also, the head unit 30 moves horizontally in the X direction along the feed screw 17, when the motor 18 rotates. Accordingly, the head unit 30 moves in both the X direction and the Y direction, when the motors 14 and 18 rotate. Besides, a recognition device 40 is provided at a side of the substrate 1 which is fixed in its position by the guide rails 11.

With reference to FIG. 2, a plurality of tape feeders 21 are placed on both sides of the guide rails 11. Electronic components requiring a lower accuracy of mounting position such as tip resistors, tip capacitors, and the like are stored inside of the tape feeders 21. Bulk feeders are also utilized for storing electronic components that require a lower accuracy of mounting position.

Figure 4:
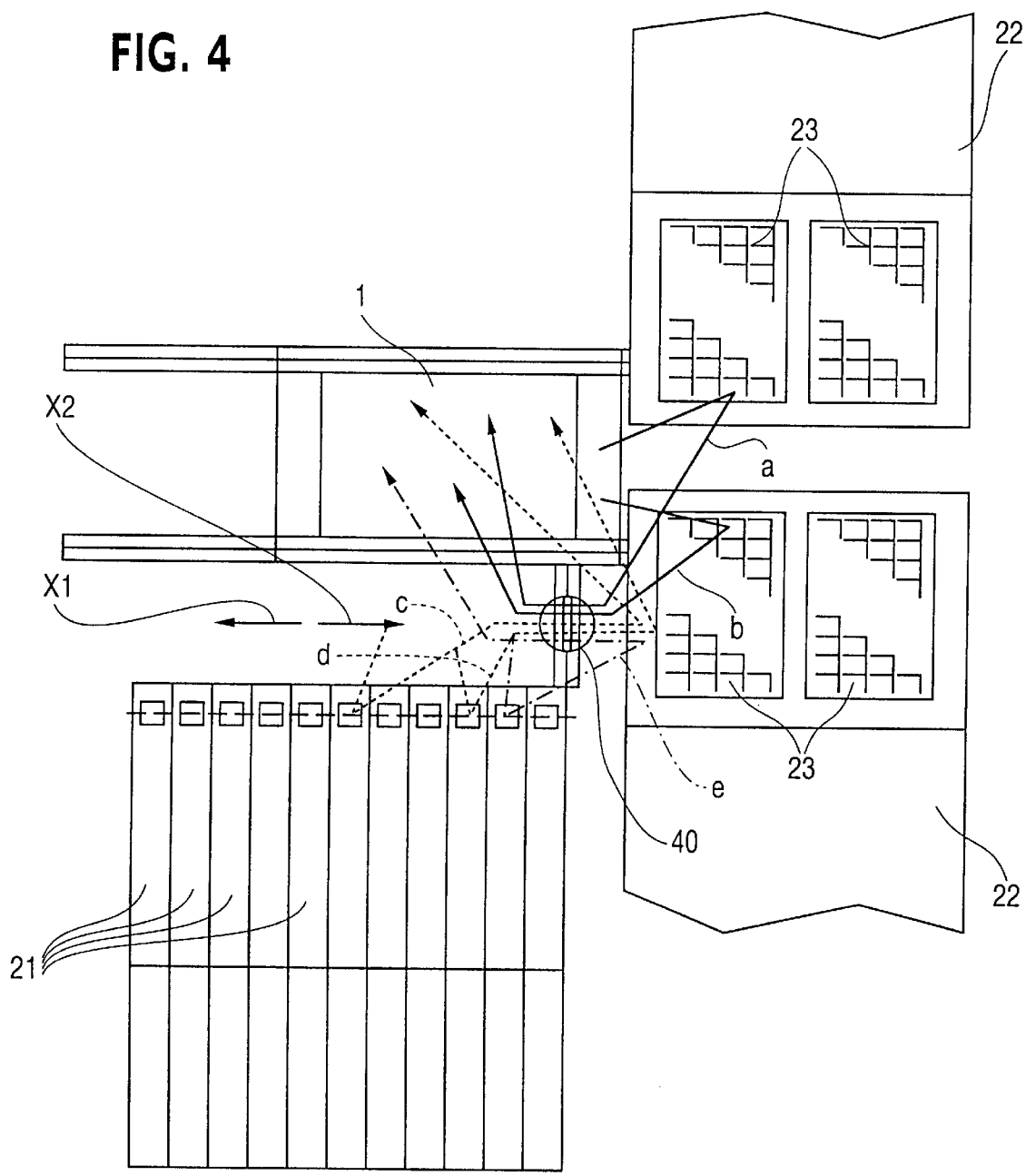
FIG. 4 is a plan view depicting moving loci of the transfer head of the electronic-component mounting apparatus of FIG. 1.

Referring to FIG. 2, tray feeders 22 having a long length are provided at a downstream side from the substrate 1 (at the right side in the figure) in a direction orthogonal to the guide rails 11. The tray feeders 22 are provided with trays 23. While there are eight trays 23 in total, four trays 23 among them located in the center as shown in FIG. 4 are in the supply position of the electronic components for the head unit 30, and the other trays 23 positioned two at each sideare in standby positions. When the electronic components in the trays 23 in their supply position run out, they are replaced with the trays 23 in the standby positions. These trays 23 hold the electronic components requiring a higher accuracy of mounting position such as QFPs.

Figure 3:
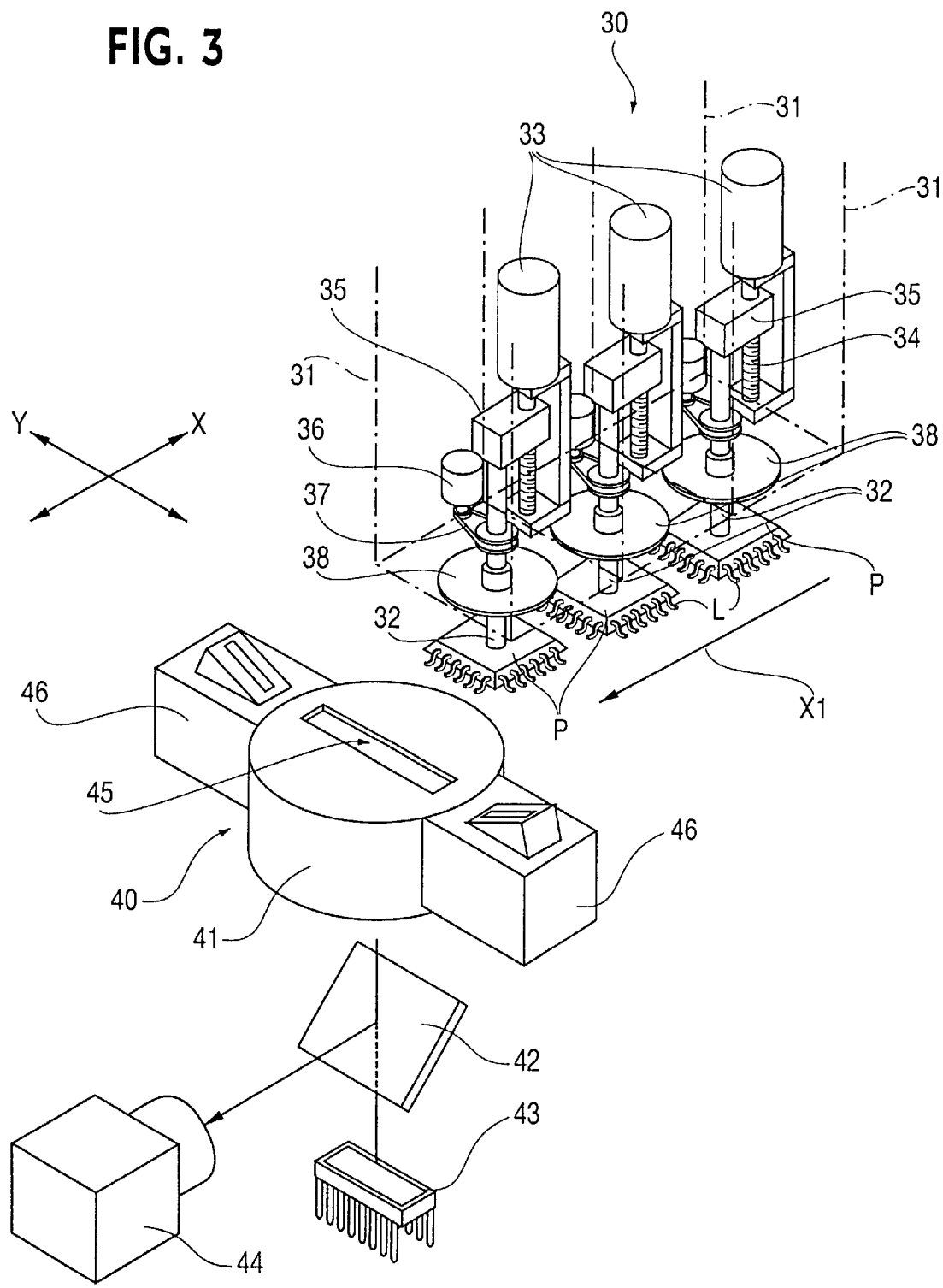
FIG. 3 is a perspective view depicting a transfer head and a recognition device of the electronic-component mounting apparatus of FIG. 1.

Referring now to FIG. 3, the head unit 30 and the recognition device 40 are described. The head unit 30 is a multiple-type head unit having a plurality of transfer heads 31 (three heads in the present embodiment) connected laterally in a row. The three transfer heads 31 have an identical structure comprising a nozzle 32, a motor 33 for driving the nozzle 32 into a vertical movement, a feed screw 34, a nut 35, a motor 36 for driving the nozzle 32 in a θ rotation, a belt 37, and a back plate 38 for dispersing illuminating light. A letter "P" represents an electronic component sucked with vacuum at a lower tip of the nozzle 32. These electronic components are QFPs having leads "L". Since these electronic components P have a plurality of the leads L with a narrow spacing therebetween, they require a high accuracy in the mounting positions in order to mount them by aligning the positions precisely on electrodes of the substrate 1.

The recognition device 40 comprises a half mirror 42, a line sensor 43 and an area type CCD camera 44 disposed under a main housing 41. The main housing 41 is provided with a slit 45 on its upper surface for receiving a light, and the light incident through it is reflected by the half miller 42 and enters into the CCD camera 44. The light also enters into the line sensor 43 by passing through the half miller 42. The slit 45 has its longitudinal side in line with the Y direction. Lighting units 46 are provided at both sides of the main housing 41 for irradiating light to the electronic components P.

The electronic-component mounting apparatus constructed as above operates in a manner as described next. Calibration of the nozzle 32 is performed prior to mounting the electronic component on the substrate 1. A purpose of the calibration of the nozzle 32 is to determine a center of rotation of the nozzle 32 on the transfer head 31. Referring to FIG. 3, the calibration is performed by discerning the nozzle 32 with the line sensor 43, while moving the head unit 30 in an X1 direction above the recognition device 40 (reference is also made to FIG. 2). The X1 direction is a direction orthogonal to the longitudinal direction of the line sensor 43, which corresponds with a direction for the head unit 30 to move from the right side to the left side in FIG. 2. Details of the calibration method are not described here, as they are commonly known.

Upon completion of the calibration, mounting of the electronic component on the substrate 1 begins. The mounting is carried out in the following manner. First, the transfer head 31 is transferred above the tape feeder 21 or the tray 23 in the tray feeder 22, and an electronic component is picked up by moving the nozzle 32 into a vertical direction. The transfer head 31 is then moved above the recognition device 40, and a position of the electronic component is discerned while maintaining the transfer head 31 to continue its movement in the X direction. The positional discernment is carried out by the line sensor 43 or the CCD camera 44. A positional deviation of the electronic component is calculated by a controller (not shown in the figures) based on a result of the discernment, and the electronic component is mounted on the substrate 1 after the derived deviations in position is corrected. In the derived deviation, positional deviation in the X- and the Y directions are corrected by an adjustment of moving distance of the transfer head 31 in the X- and the Y directions by way of driving the X table and the Y table, and a positional deviation in the θ angle (horizontal rotational angle) is corrected with a rotation of the nozzle 32 by θ degrees around its vertical axis by driving the motor 36 (in FIG. 3).

FIG. 4 depicts moving loci of the transfer head 31 when the electronic components are mounted in the manner as described above. In the figure, solid arrows "a" and "b" depict moving loci for mounting electronic components contained in the tray 23 of the tray feeder 22, and dotted arrows "c" and "d" depict moving loci for mounting electronic components contained in the tape feeder 21. As shown in the figure, all of the four trays 23 in the supply position at the center are collectively placed at one side (the right side in FIG. 4) with respect to the longitudinal direction of the line sensor 43. Accordingly, the transfer head 31 that picks up the electronic component contained in the trays 23 always moves in the same fixed direction (the X1 direction) as shown by the solid arrows "a" and "b", so that the electronic components are scanned and discerned by the line sensor 43.

Also, all of the plurality of tape feeders 21 are collectively placed at the other side (the left side in FIG. 4) with respect to the longitudinal direction of the line sensor 43. Therefore, the transfer head 31 that picks up the electronic component contained in these tape feeders 21 always moves in the same direction (the X2-direction) as shown by the dotted arrows "c" and "d", so that the electronic components are scanned and discerned by the line sensor 43.

As has been described in an example of the prior art there is a difference in flow speed of the signal output by the line sensor 43 depending on the direction of scanning, and this difference has been the cause of deteriorating the discerning accuracy. As a consequence, the present embodiment places the trays 23 containing the electronic components requiring a higher accuracy of mounting position such as QFPs at one side (the right side in FIG. 4) of the line sensor 43, as aforementioned, so as to discern positions of the electronic components in the trays 23 by scanning them in the same direction (the X1 direction) as in the case of calibration at all times. This eliminates the deterioration of accuracy in detecting the position caused by the above reason, thereby enabling mounting of the electronic components contained in all of the trays 23 on the substrate 1 with a high positional accuracy.

On the contrary, the electronic components such as tip resistors and tip capacitors contained in the tape feeders 21 requiring a lower accuracy of mounting position are mounted on the substrate 1 by discerning positions with the scanning made in a direction (the X2 direction), which is opposite to the calibrating direction (the X1 direction), as shown by the dotted arrows "c" and "d". Although the accuracy in detecting the positions decreases in this case, because the scanning direction is the opposite, the required accuracy for the mounting positions can still be satisfied. Although the positional discernment can be made for the electronic components in the tape feeders 21, as a matter of course, by scanning them also in the X1 direction by making the transfer head 31 to move by a detour through the right side of the recognition device 40 as shown by a dotted arrow "e" in FIG. 4, it reduces the mounting efficiency since a moving distance of the transfer head 31 becomes longer.

Second Exemplary Embodiment

Figure 5:
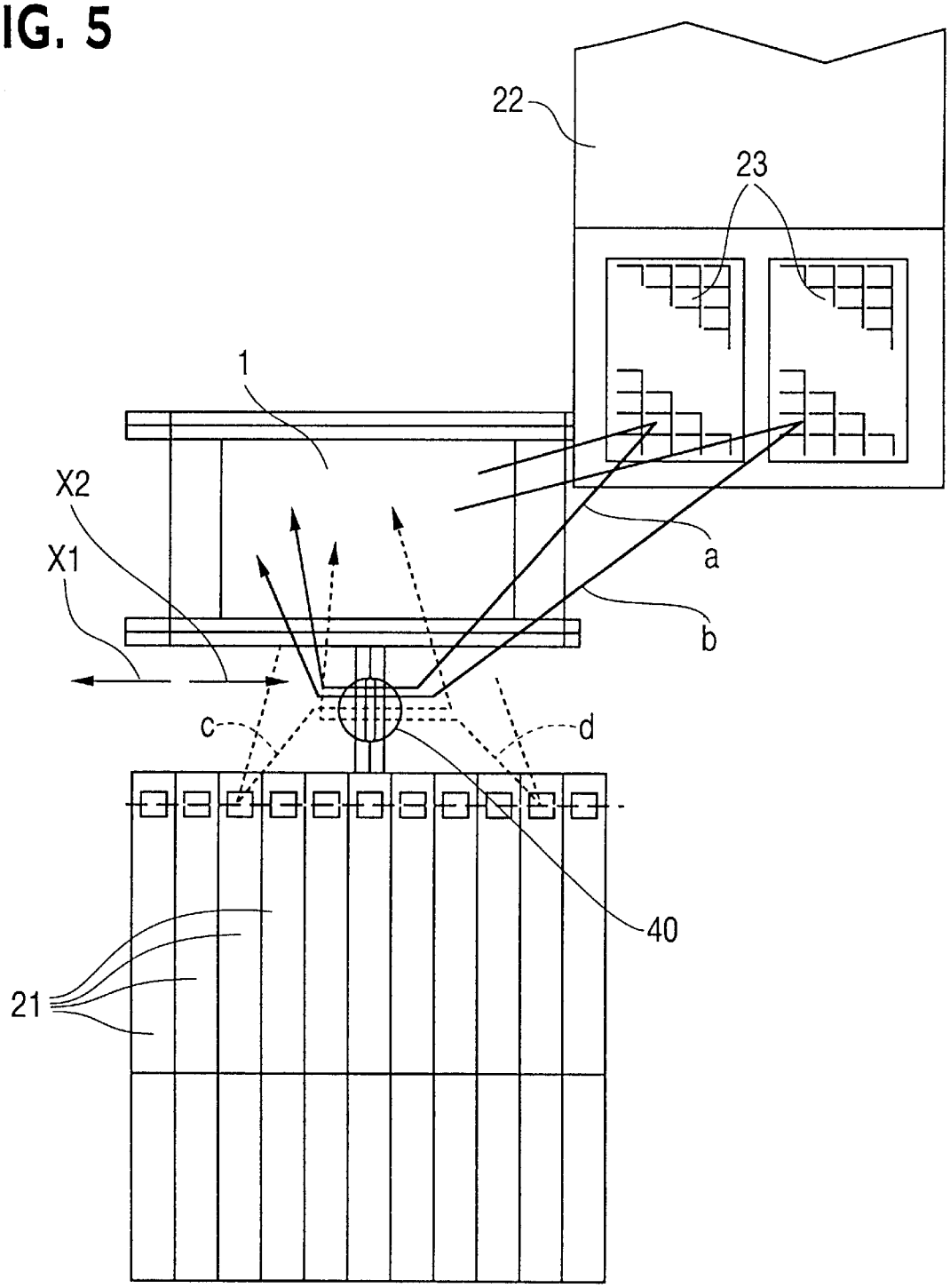
FIG. 5 is a plan view depicting moving loci of a transfer head of an electronic-component mounting apparatus of a second exemplary embodiment of the present invention.
Figure 6:
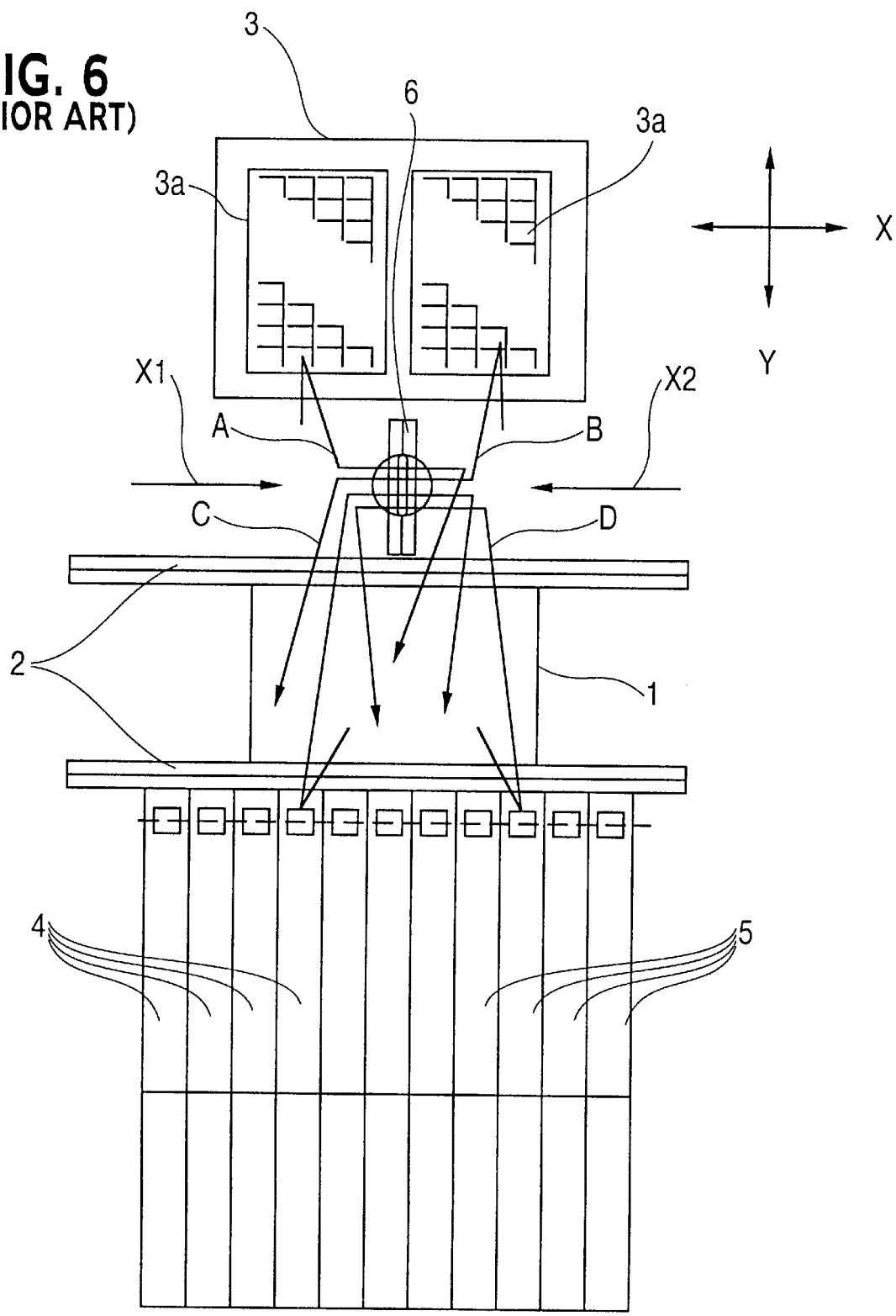
FIG. 6 is a plan view depicting moving loci of a transfer head of an electronic-component mounting apparatus of the prior art.

A method and an apparatus for mounting electronic components of a second exemplary embodiment of the present invention will now be described by referring to FIG. 5.

In the present embodiment, a recognition device 40 is mounted in the center part of a row of serially placed plurality of tape feeders 21. Trays 23 in a tray feeder 22 are collectively placed at the right side of the recognition device 40. Therefore, all of the electronic components from the trays 23 are scanned in the X1 direction as shown by solid arrows "a" and "b". To the contrary, some electronic components from the tape feeders 21 are scanned in the X2 direction as represented by a dotted arrow "c", while the other electronic components are scanned in the X1 direction as represented by a dotted arrow "d". Therefore, all of the electronic components in the trays 23 are mounted on the substrate 1 with a high positional accuracy, whereas an accuracy of the detected positions for the electronic components from the tape feeders 21 disperses depending on the scanning directions. The required accuracy for mounting positions is satisfied, nevertheless. Also, a mounting efficiency is improved, since the transfer head travels a shortest distance from positions where it picks up the electronic components.

From the foregoing, it is apparent that since the present invention obtains image data by moving the electronic components requiring a higher accuracy of mounting position in one and the same direction over the line sensor, and performs the calibration of the nozzle to be executed prior to mounting the electronic component preferably in the same direction as the above scanning direction, an error in the positional data of the electronic components due to the scanning directions is thereby eliminated, and an accurate mounting of the electronic components on the substrate is enabled by obtaining their positions accurately.

Although the present embodiment as has been described is an exemplar, in that the electronic components are picked up by the nozzle on the transfer head with vacuum suction, this is not exclusive, and the electronic components can be picked up by any other means beside the vacuum suction.

What is claimed is:

1. A method of mounting electronic components for use with a line sensor, a substrate, a transfer head having an electronic-component pickup unit, and electronic components including electronic components requiring a higher accuracy of mounting position and electronic components requiring a lower accuracy of mounting position, said method comprising:

picking up the electronic components with the electronic component pickup unit provided on the transfer head;

discerning a position of an electronic component requiring higher accuracy by moving the electronic component requiring higher accuracy over the line sensor in a fixed direction along a line orthogonal to a longitudinal direction of the line sensor; and mounting the electronic component requiring higher accuracy on the substrate based on the position of the electronic component requiring higher accuracy discerned by said discerning.

2. A method as claimed in claim 1, further comprising calibrating a position of the electronic-component pickup unit by moving the electronic-component pickup unit in said fixed direction.

3. A method as claimed in claim 1, further comprising discerning a position of an electronic component requiring lower accuracy by moving the electronic component requiring lower accuracy in a direction opposite to said fixed direction.

4. A method as claimed in claim 1, further comprising discerning a position of an electronic component requiring lower accuracy by moving the electronic component requiring lower accuracy in either of said fixed direction and a direction opposite to said fixed direction.

5. A method of mounting electronic components for use with part feeders provided with electronic components requiring a higher accuracy of mounting position, other part feeders provided with electronic components requiring a lower accuracy of mounting position, a transfer head having a nozzle, an X table and a Y table for driving the transfer head, a substrate, and a line sensor having a longitudinal direction, said method comprising:

picking up an electronic component, from at least one of the part feeders provided with electronic components requiring a higher accuracy of mounting position and the other part feeders provided with electronic components requiring a lower accuracy of mounting position, with the nozzle on the transfer head;

transferring and mounting the electronic component on the substrate after discerning a position of the electronic component by moving the transfer head, including the electronic component, over the line sensor in a direction orthogonal to a longitudinal direction of the line sensor; and positioning the part feeders provided with electronic components requiring a higher accuracy of mounting position at one side with respect to the longitudinal direction of the line sensor such that said discerning of position is performed by moving the transfer head, including the electronic component, over the line sensor in a fixed direction.

6. A method as claimed in claim 5, further comprising calibrating the nozzle in said fixed direction prior to said mounting of the electronic component.

7. A method as claimed in claim 5, further comprising discerning a position of an electronic component requiring lower accuracy by moving the transfer head, including the electronic component requiring lower accuracy, in either of said fixed direction and a direction opposite to said fixed direction.

8. An electronic-component mounting apparatus for use with electronic components including electronic components requiring a higher accuracy of mounting position and electronic components requiring a lower accuracy of mounting position, said apparatus comprising:

a recognition device, including a line sensor having a longitudinal direction, operable to discern a position of an electronic component moving over said line sensor in a direction orthogonal to the longitudinal direction of said line sensor;

a first part feeder, located at one side of said recognition device along the direction orthogonal to the longitudinal direction of said line sensor in said recognition device, operable to provide electronic components requiring a higher accuracy of mounting position;

a second part feeder operable to provide electronic components requiring a lower accuracy of mounting position; and a transfer head, including a pickup unit, operable to pick up an electronic component from said first part feeder and said second part feeder.

9. An electronic-component mounting apparatus as claimed in claim 8, wherein said transfer head is operable to discern a position of the electronic component by moving the electronic component over said line sensor in a fixed direction when said transfer head picks up the electronic component from said first part feeder.

10. An electronic-component mounting apparatus as claimed in claim 9, wherein said transfer head is operable to discern a position of the electronic component by moving the electronic component over said line sensor in a direction opposite to said fixed direction when said transfer head picks up the electronic component from said second part feeder.

11. An electronic-component mounting apparatus as claimed in claim 9, wherein said transfer head is operable to discern a position of the electronic component by moving the electronic component over said line sensor in any of said fixed direction and a direction opposite to said fixed direction when said transfer head picks up the electronic component from said second part feeder.

12. An electronic-component mounting apparatus as claimed in claim 9, wherein said pickup unit provided on said transfer head is calibrated for position by moving in said fixed direction.

13. An electronic-component mounting apparatus as claimed in claim 8, wherein said transfer head is operable to discern a position of the electronic component by moving the electronic component over said line sensor in a direction opposite to said fixed direction when said transfer head picks up the electronic component from said second part feeder.

14. An electronic-component mounting apparatus as claimed in claim 8, wherein said transfer head is operable to discern a position of the electronic component by moving the electronic component over said line sensor in any of said fixed direction and a direction opposite to said fixed direction when said transfer head picks up the electronic component from said second part feeder.

15. An electronic-component mounting apparatus as claimed in claim 8, wherein said second part feeder is located at the other side of said recognition device along the direction orthogonal to the longitudinal direction of said line sensor.

16. An electronic-component mounting apparatus as claimed in claim 8, wherein said second part feeder is located at both sides of said recognition device along the direction orthogonal to the longitudinal direction of said line sensor.

17. An electronic-component mounting apparatus for use with electronic components including electronic components requiring a higher accuracy of mounting position and electronic components requiring a lower accuracy of mounting position, said apparatus comprising:

a plurality of first part feeders operable to provide electronic components requiring a higher accuracy of mounting position;

a plurality of second part feeders operable to provide electronic components requiring a lower accuracy of mounting position;

a transfer head operable to pick up an electronic component from at least one of said plurality of first and second part feeders; and a line sensor operable to discern a position of the electronic component picked up by said transfer head;

wherein said plurality of first part feeders is located on one side of said line sensor such that said transfer head is operable to move an electronic component over said line sensor in a fixed direction.

18. An electronic-component mounting apparatus as claimed in claim 17, wherein said nozzle is calibrated in said fixed direction.

19. An electronic-component mounting apparatus as claimed in claim 17, wherein said plurality of second part feeders is located on both sides of said line sensor such that said transfer head is operable move an electronic component over said line sensor in any of said fixed direction and a direction opposite to said fixed direction.

* * * * *